United States Patent
Loubet et al.

(10) Patent No.: US 12,426,228 B2
(45) Date of Patent: Sep. 23, 2025

(54) SRAM WITH STAGGERED STACKED FET

(71) Applicant: INTERNATIONAL BUSINESS MACHINES CORPORATION, Armonk, NY (US)

(72) Inventors: Nicolas Jean Loubet, Guilderland, NY (US); Kirsten Emilie Moselund, Ruschlikon (CH); Bogdan Cezar Zota, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 554 days.

(21) Appl. No.: 17/822,146

(22) Filed: Aug. 25, 2022

(65) Prior Publication Data
US 2024/0074135 A1     Feb. 29, 2024

(51) Int. Cl.
H10B 10/00     (2023.01)

(52) U.S. Cl.
CPC .................................. *H10B 10/125* (2023.02)

(58) Field of Classification Search
CPC .. H10B 10/125; H10B 10/12; H10D 84/0149; H10D 30/014; H10D 30/43; H10D 84/0135
See application file for complete search history.

(56) References Cited

U.S. PATENT DOCUMENTS

| | | |
|---|---|---|
| 6,201,267 B1 | 3/2001 | Gupta |
| 10,741,456 B2 | 8/2020 | Cheng |
| 10,790,271 B2 | 9/2020 | Zheng |
| 11,164,870 B2 | 11/2021 | Wu |
| 11,177,258 B2 | 11/2021 | Ruilong |
| 2008/0283995 A1* | 11/2008 | Bucki ................. H01L 25/0657 438/455 |
| 2018/0122793 A1* | 5/2018 | Moroz .................. G06F 30/392 |
| 2020/0279847 A1 | 9/2020 | Pillarisetty |

FOREIGN PATENT DOCUMENTS

GB     1212279 A     11/1970

\* cited by examiner

*Primary Examiner* — Changhyun Yi
(74) *Attorney, Agent, or Firm* — Samuel A. Waldbaum

(57) ABSTRACT

A microelectronic structure including a bottom transistor having a gate region aligned along a first axis. An upper transistor located on top of the bottom transistor, where the upper transistor has a gate region that is aligned along a second axis, and where the second axis is perpendicular to the first axis.

18 Claims, 8 Drawing Sheets

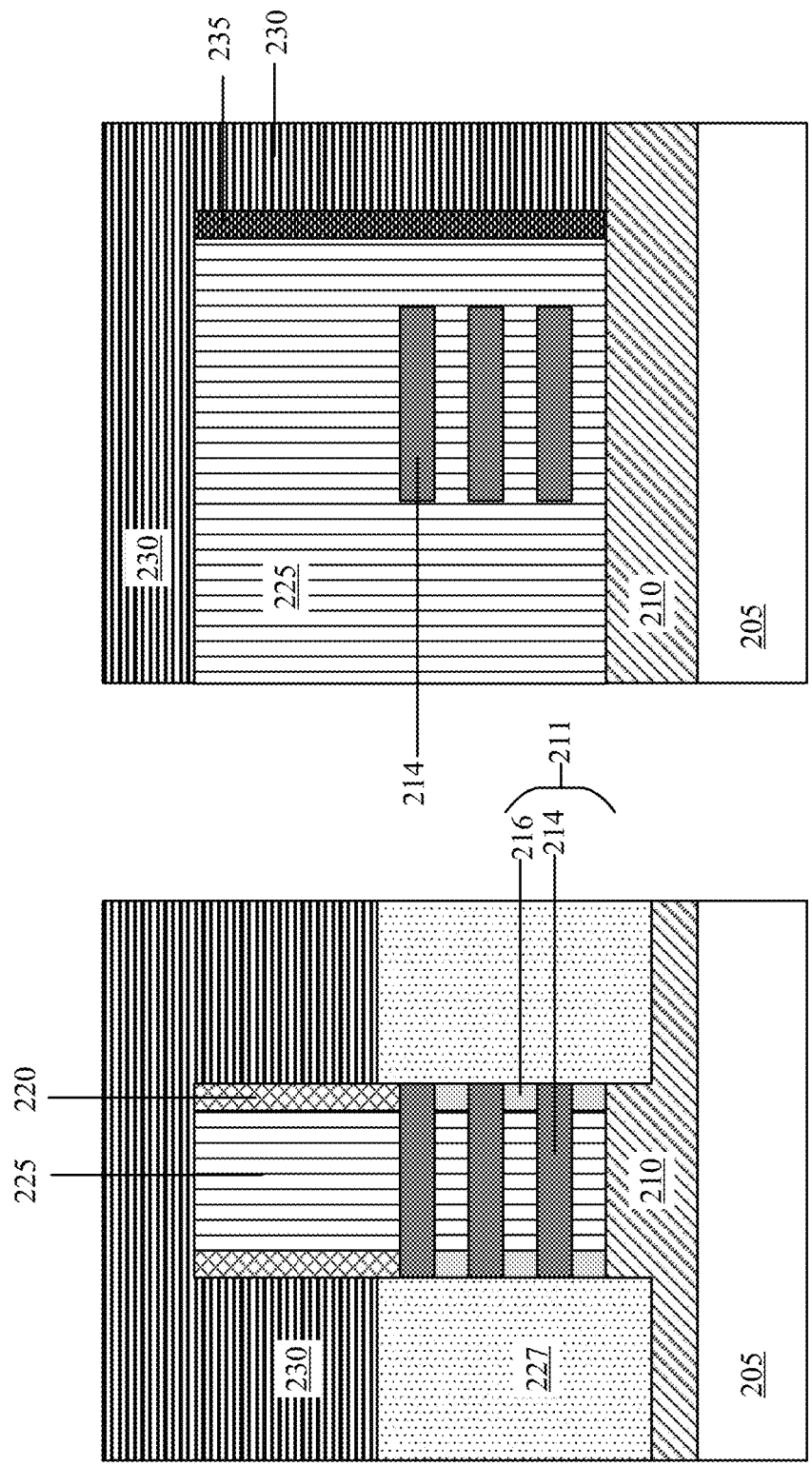

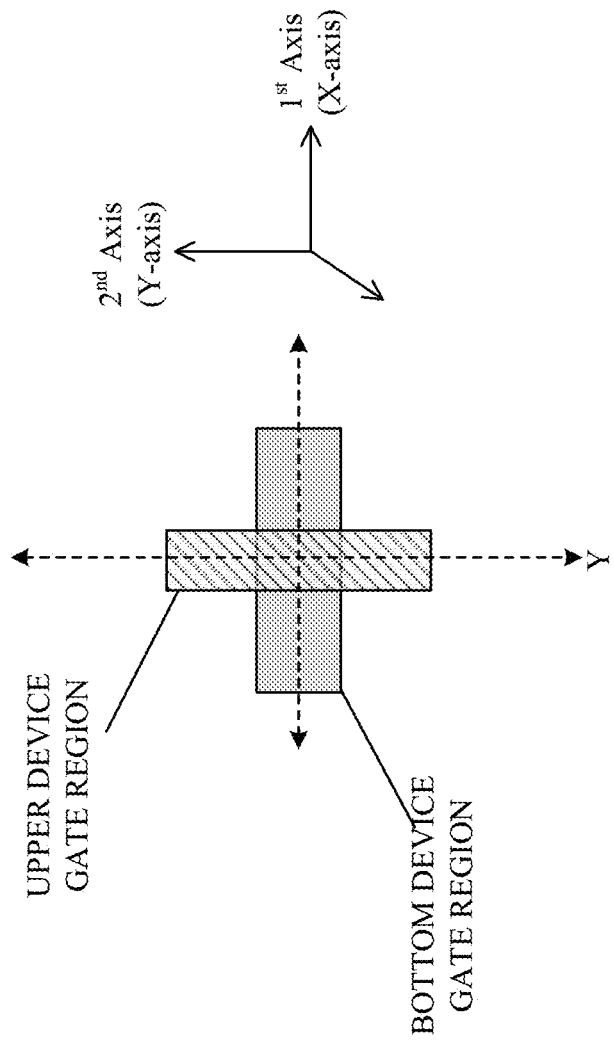

SRAM WITH STAGGERED STACKED FET

BACKGROUND

The present invention generally relates to the field of microelectronic, and more particularly to formation of an interconnected located in a gate cut, where the interconnected connects at least two components on different devices.

Nanosheet is the lead device architecture in continuing CMOS scaling. However, nanosheet technology has shown issues when scaling down such that as the devices become smaller and closer together, they are interfering with each other. A way to increase the device density is by stacking the devices. Stacking the devices causes the combined height to be increased which can lead to the stack device collapsing.

BRIEF SUMMARY

Additional aspects and/or advantages will be set forth in part in the description which follows and, in part, will be apparent from the description, or may be learned by practice of the invention.

A microelectronic structure including a bottom transistor having a gate region aligned along a first axis. An upper transistor located on top of the bottom transistor, where the upper transistor has a gate region that is aligned along a second axis, and where the second axis is perpendicular to the first axis.

The microelectronic structure includes a bottom transistor having a gate region aligned along a first axis, where the bottom transistor extends a first length along the first axis. An upper transistor located on top of the bottom transistor, where the upper transistor has a gate region that is aligned along a second axis. The second axis is perpendicular to the first axis. The upper transistor extends a second length along the second axis, and wherein the first length and the second length are different.

A method including forming a first transistor on a first substrate and forming a second transistor on a second substrate. The first substrate and the second substrate are different substrates. Attaching the second transistor on top of the first transistor. The first transistor is aligned along a first axis, and the second transistor is aligned on a second axis. The second axis is perpendicular to the first axis.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 3 illustrates a first cross section view of a second device, in accordance with the embodiment of the present invention.

FIG. 4 illustrates a second cross section view of the second device, in accordance with the embodiment of the present invention.

FIG. 5 illustrates a top-down view of the second device being stacked on top of the first device, in accordance with the embodiment of the present invention.

DETAILED DESCRIPTION

Figures 1, 2:
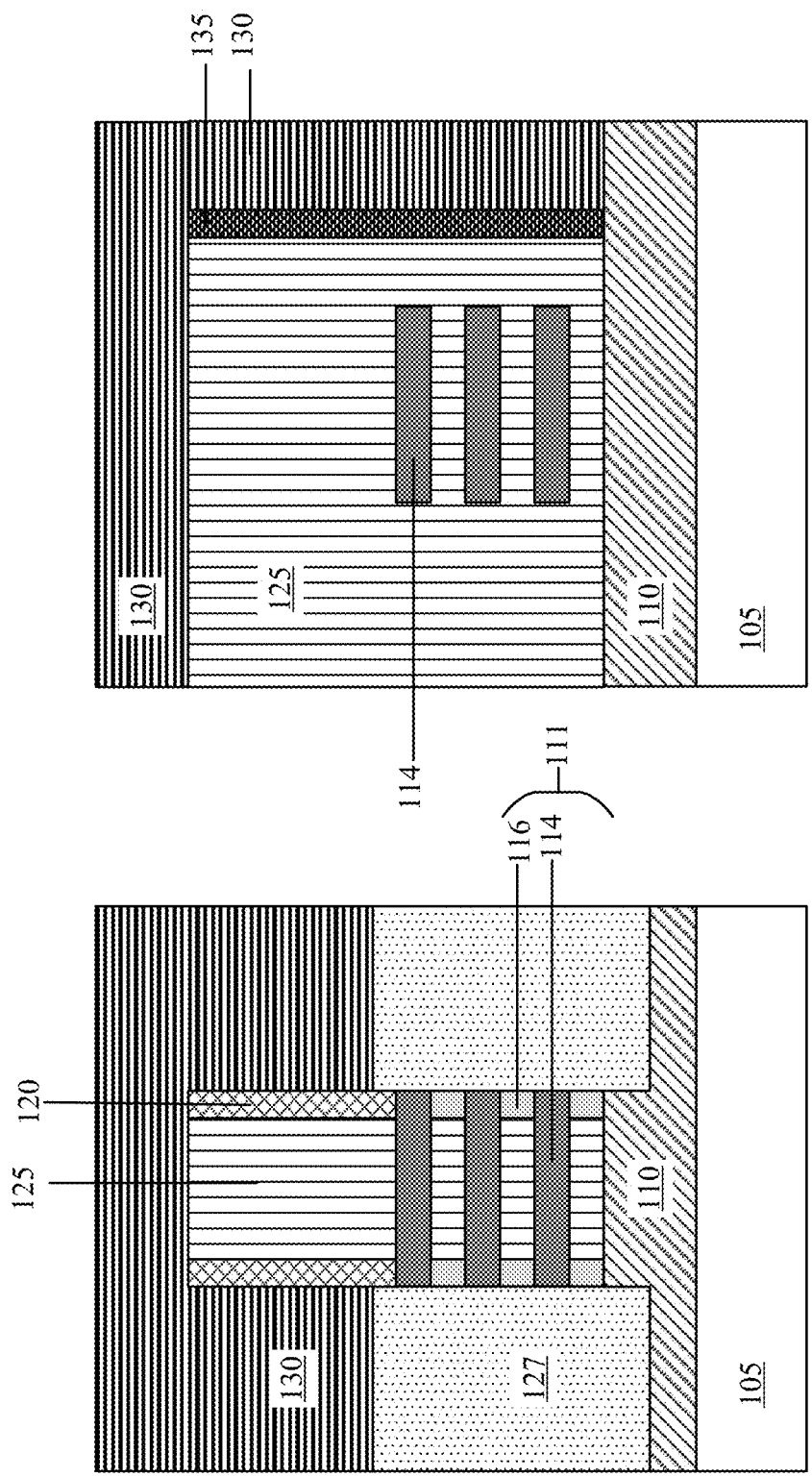
FIG. 1 illustrates a first cross section view of a first device, in accordance with the embodiment of the present invention.
FIG. 2 illustrates a second cross section view of the first device, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "bottom," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards forming a stacked device where the upper device is aligned perpendicular to the alignment of the bottom device. For example, the gate region of the bottom device is along the first axis and the gate region of the upper device is along a second axis, which would cause the gate region of the bottom device to be perpendicular to the gate region of the upper device. The bottom device is fabricated independently of the upper device, i.e., the upper device is not fabricated on top of the bottom device. When an upper device is fabricated on top of a bottom device, it can lead to fabrication issues caused by the height of the stacked structure. The fabrications issues caused by the increased height of a stacked structure can be prevented by fabricating the bottom device independently of the upper device. Also, fabricating the bottom device independently of the upper device allows for more flexibility in the alignment of the devices. Once the devices are fabricated then the upper device is bonded/attached to the bottom device, however the alignment of the devices is different, such that the gate regions of the upper device is perpendicular to the gate region of the bottom device.

Usually, the alignment of the stacked devices has components of the upper device and the components of the bottom device aligned in the same direction. This means that the upper devices and the bottom device overlap with each other for the length of the devices.

In contrast the present invention has the upper device aligned perpendicular to the bottom device. For example, the gate region of the bottom device is along the first axis and the gate region of the upper device is along a second axis, which would cause the gate region of the bottom device to be perpendicular to the gate region of the upper device. Therefore, the upper device only overlaps with the bottom device at the location where the device cross over each other. Thus, portions of the bottom device do not have the upper device aligned above it, and portions of the upper device do not have the bottom device aligned below it. Furthermore, by aligning the upper device perpendicular to the bottom device allows for different arrangements of contacts for both of the devices. For example, if the bottom devices has a gate region aligned along a first axis (e.g., X-axis) and the upper device has a gate region aligned along the second axis (e.g., the Y-axis) than the source/drain of the upper device will be located on top of the gate region of the bottom device. However, the source/drain region of the bottom device is not located beneath the gate region of upper device.

FIGS. 1, 2, 3, and 4 illustrate the cross sections of a first device and a second device after the independent fabrication of each device. The first device is formed on top of a first buried oxide layer 110 which is located on top of a first substrate 105. The first substrate 105 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the first substrate 105. In some embodiments, the first substrate 105 includes both semiconductor materials and dielectric materials. The semiconductor first substrate 105 may also comprise an organic semiconductor or a layered semiconductor such as, for example, Si/SiGe, a silicon-on-insulator or a SiGe-on-insulator. A portion or the entire semiconductor first substrate 105 may also be comprised of an amorphous, polycrystalline, or monocrystalline. The semiconductor first substrate 105 may be doped, undoped or contain doped regions and undoped regions therein.

The first device includes a first nano stack 111 which includes a plurality of first channel layers 114 (i.e., nanosheets) and a first inner spacer 116. The plurality of first channel layers 114 can be comprised of, for example, Si. The first inner spacer 116 is located adjacent to the first gate 125. The first gate 125 encloses the each of the plurality of first channel layers 114. A first upper spacer 120 is located on top of a first channel layer 114 and the first gate 125 is located between sections of the first upper spacer 120. The number of layers illustrated in the first nano stack 111 is for illustrative purposes only, the first nano stacks 111 can be comprised fewer or more layers than what is illustrated by the Figures. Furthermore, the Figures illustrates that the first upper spacer 120 is located on top of a first channel layer 114, alternatively the first upper spacer 120 can be located on top of the first inner spacer 116. The first gate 125 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. A first source/drain 127 is located on the sides of the first nano stacks 111.

The first source/drain 127 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. A first interlayer dielectric 130 is located on top of the first source/drain 127. The first interlayer dielectric 130 is located adjacent the first upper spacer 120 and on top of the first gate 125. As illustrated by FIG. 2, a first spacer 135 can be located adjacent to the first gate 125 and the first interlayer dielectric 130.

FIGS. 3 and 4 illustrates that the second device is formed on top of a second buried oxide layer 210 which is located on top of a second substrate 205. The second substrate 205 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the second substrate 205. In some embodiments, the second substrate 205 includes both semiconductor materials and dielectric materials. The semiconductor second substrate 205 may also comprise an organic semiconductor or a layered semiconductor such as, for example, Si/SiGe, a silicon-on-insulator or a SiGe-on-insulator. A portion or the entire semiconductor second substrate 205 may also be comprised of an amorphous, polycrystalline, or monocrystalline. The semiconductor second substrate 205 may be doped, undoped or contain doped regions and undoped regions therein.

The second device includes a second nano stack 211 which includes a plurality of second channel layers 214 (i.e., nanosheets) and a second inner spacer 216. The plurality of second channel layers 214 can be comprised of, for example, Si. The second inner spacer 216 is located adjacent to the second gate 225. The second gate 225 encloses the each of the plurality of second channel layers 214. A second upper spacer 220 is located on top of a second channel layer 214 and the second gate 225 is located between sections of the second upper spacer 220. The number of layers illustrated in the second nano stack 211 is for illustrative purposes only, the second nano stack 211 can be comprised fewer or more layers than what is illustrated by the Figures. Furthermore, the Figures illustrates that the second upper spacer 220 is located on top of a second channel layer 214, alternatively the second upper spacer 220 can be located on top of the second inner spacer 216. The second gate 225 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. A second source/drain 227 is located on the sides of the first nano stacks 211.

The second source/drain 227 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. A second interlayer dielectric 230 is located on top of the second source/drain 227. The second interlayer dielectric 230 is located adjacent the second upper spacer 220 and on top of the second gate 225. As illustrated by FIG. 4, a second spacer 235 can be located adjacent to the second gate 225 and the second interlayer dielectric 230.

FIG. 5 illustrates a top-down view after the second device was attached to the first device. The second substrate 205 is removed and the second device is attached to the top of the first device by a bonding oxide 305 (as illustrated in, for example, FIG. 7). The first device ("bottom device") and the second device ("upper device") are fabricated independently, i.e., the second device is not fabricated on top of the bottom device, but rather (after fabrication) attached onto the first device. From this point on the first device will be referred to as the bottom device and the second device will be referred to as the upper device.

When an upper device is fabricated on top of a bottom device, it can lead to fabrication issues associated with the overall height of the structure. Traditionally the stacked devices layers are processed simultaneously causing the creation of high aspect ratio fins. These high aspect ratio fins can collapse, bend, or fail during the fabrication process of the devices.

The fabrications issues caused by the increased height of a stacked structure can be prevented by fabricating the bottom device independently of the upper device. The fabrication issues can be prevented because high aspect ratio fins are not created during the fabrication of the individual devices. Also, by fabricating the bottom device independently of the upper device allows for more flexibility in the alignment of the devices. Once the bottom devices are fabricated then the upper device is bonded/attached to the bottom device, however the alignment of the devices is different than the usual alignment of stacked devices.

Usually, the alignment of the stacked devices has components of the upper device and the components of the bottom device aligned in in the same direction. For example, the upper device and the bottom device are aligned along the first axis. This means that the upper devices and the bottom device overlap with each other for the length of the devices.

In contrast the present invention uses an offset alignment for the upper device and the bottom device as illustrated by FIG. 5. The upper device gate region is aligned perpendicular to the bottom device gate region. For example, this means the gate region of bottom device is aligned along the first axis (e.g., the X-axis) and the gate region of the upper device is aligned along the second axis (e.g., the Y-Axis). Therefore, the upper device only overlaps with the bottom device at the location where the devices cross over each other. Thus, portions of the bottom device do not have the upper device aligned above it, and portions of the upper device do not have the bottom device aligned below it. For example, if the bottom devices has a gate region aligned along a first axis (e.g., X-axis) and the upper device has a gate region aligned along the second axis (e.g., the Y-axis) than the source/drain of the upper device will be located on top of the gate region of the bottom device. However, the source/drain region of the bottom device is not located beneath the gate region of upper device. Furthermore, by aligning the upper device perpendicular to the bottom device allows for different arrangements of contacts for both devices.

Figures 6, 7:
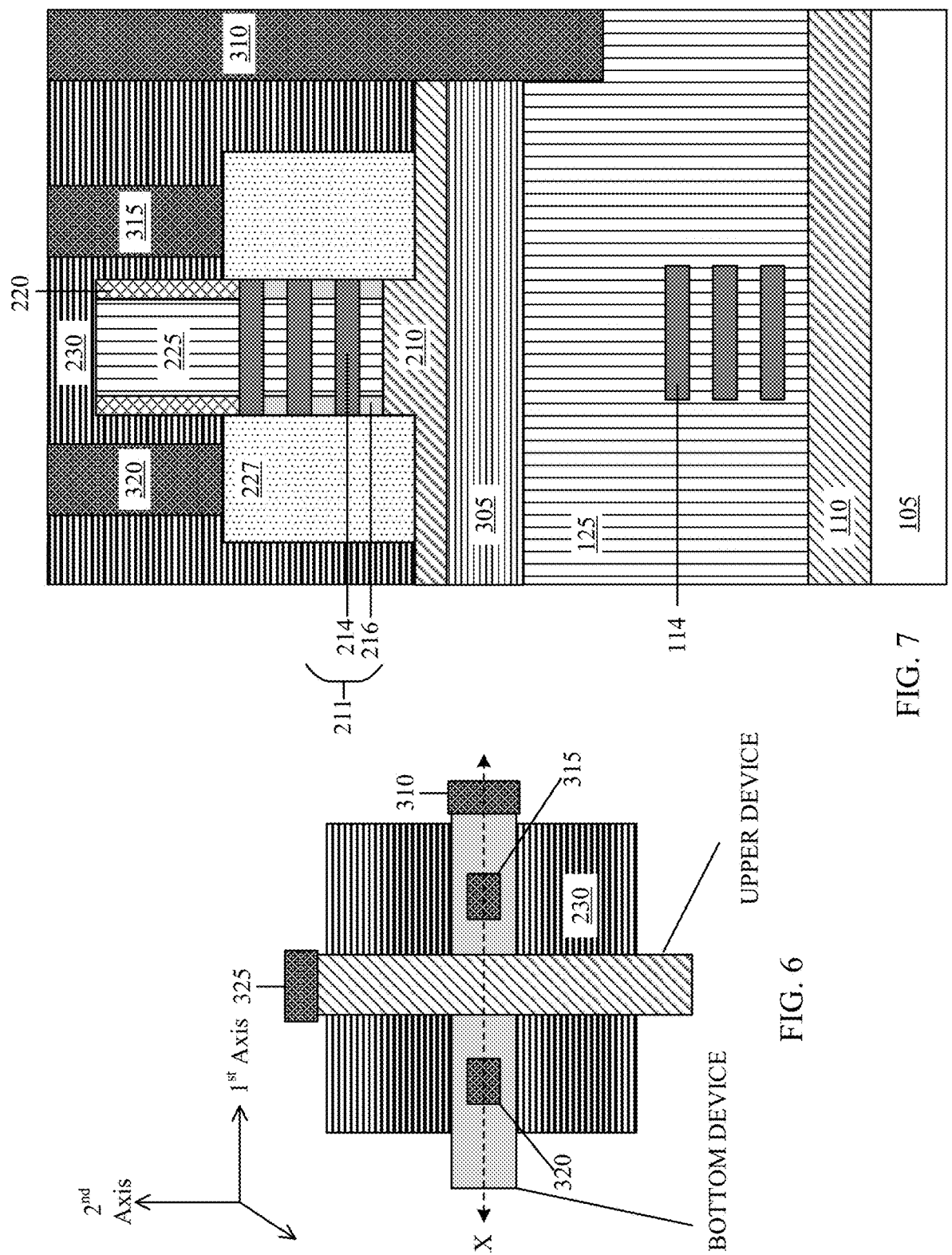
FIG. 6 illustrates a top-down view of the of the perpendicular stacked devices after the formation of contacts, in accordance with the embodiment of the present invention.
FIG. 7 illustrates a cross section X of the perpendicular stacked devices after the formation of contacts, in accordance with the embodiment of the present invention.

FIGS. 6 and 7 illustrate the process stage after fabrication of upper source/drain contacts and gate contacts. FIG. 6 illustrates that the upper source/drain contacts 315 and 320 are located above the second source/drain 227. The bottom gate contact 310 is located at the end of first gate 125. The bottom gate contact 310 extends through the second interlayer dielectric 230, the second buried oxide layer 210, and the bonding oxide 305. The upper gate contact 325 is located at the end of the upper device, where the top gate contact 325 connects to the second gate 225. As illustrated by FIG. 6, the bottom gate contact 310 is in alignment (along the first axis) with the upper source/drain contacts 315 and 320.

Figures 8, 9:
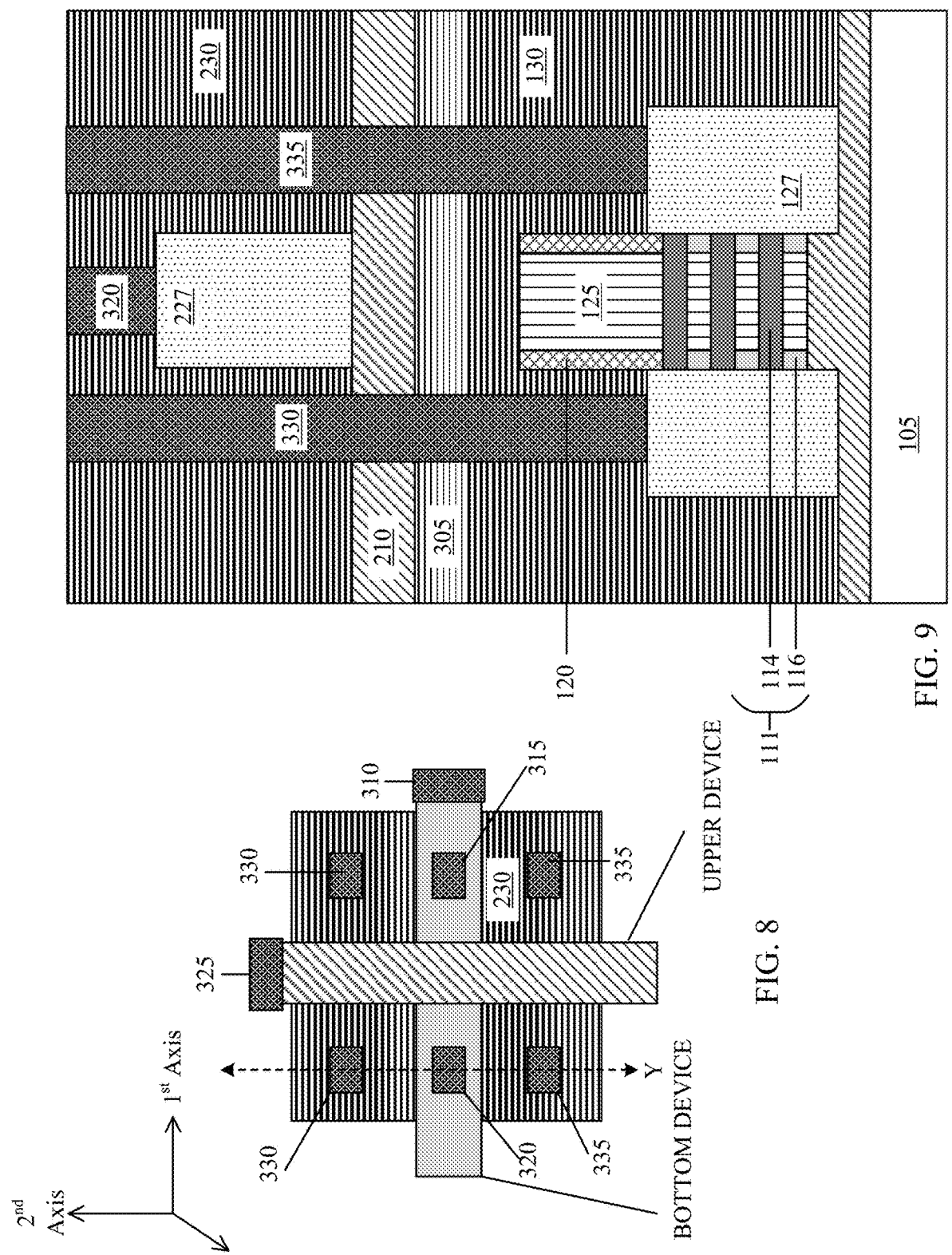
FIG. 8 illustrates a top-down view of the of the perpendicular stacked devices after the formation of bottom source/drain contacts, in accordance with the embodiment of the present invention.
FIG. 9 illustrates a cross section Y of the perpendicular stacked devices after the formation of bottom source/drain contacts, in accordance with the embodiment of the present invention.

FIGS. 8 and 9 illustrate the process stage after fabrication of bottom source/drain contacts. FIG. 8 illustrates that the bottom source/drain contacts 330, and 335 are located above the first source/drain 127. The bottom source/drain contacts 330, and 335 extend through the second interlayer dielectric 230, the second buried oxide layer 210, the bonding oxide 305, and the first interlayer dielectric 130 to reach the first source/drain 127. As illustrated by FIG. 8, a pair of bottom source/drain contacts 330, and 335 are in alignment (i.e., aligned along the second axis) with the upper source/drain contact 320.

Figure 11:
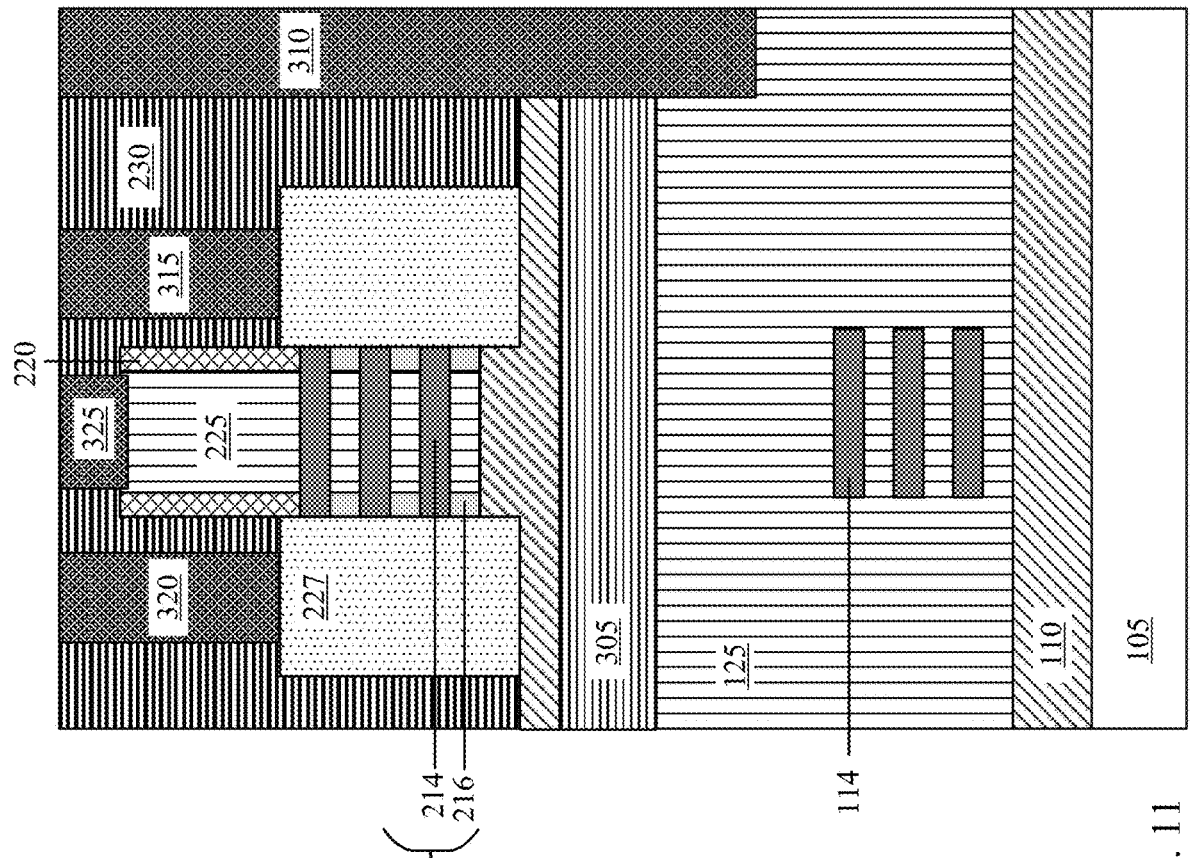
FIG. 11 illustrates a cross section Y of the perpendicular stacked devices after the formation of an upper gate contact, in accordance with the embodiment of the present invention.
Figure 10:
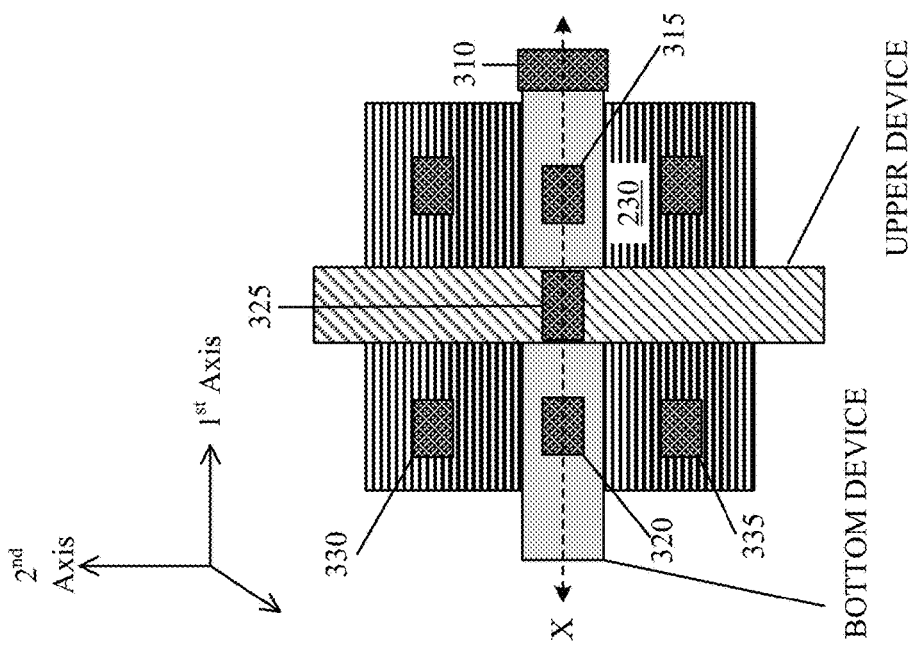
FIG. 10 illustrates a top-down view of the of the perpendicular stacked devices after the formation of an upper gate contact, in accordance with the embodiment of the present invention.

FIGS. 10 and 11 illustrate the process stage after fabrication of upper gate contact 325 at a different location then shown in FIGS. 6-10. FIGS. 10 and 11 illustrates that the upper gate contact 325 can be formed where the upper device overlaps with the bottom device. More space to be free up to allow for rearrangement of some of the contacts by locating the upper gate contact 325 at this location causes. The upper gate contact 325 is in alignment (i.e., along the first axis) with the upper source/drain contacts 315, and 320.

Figures 12, 13:
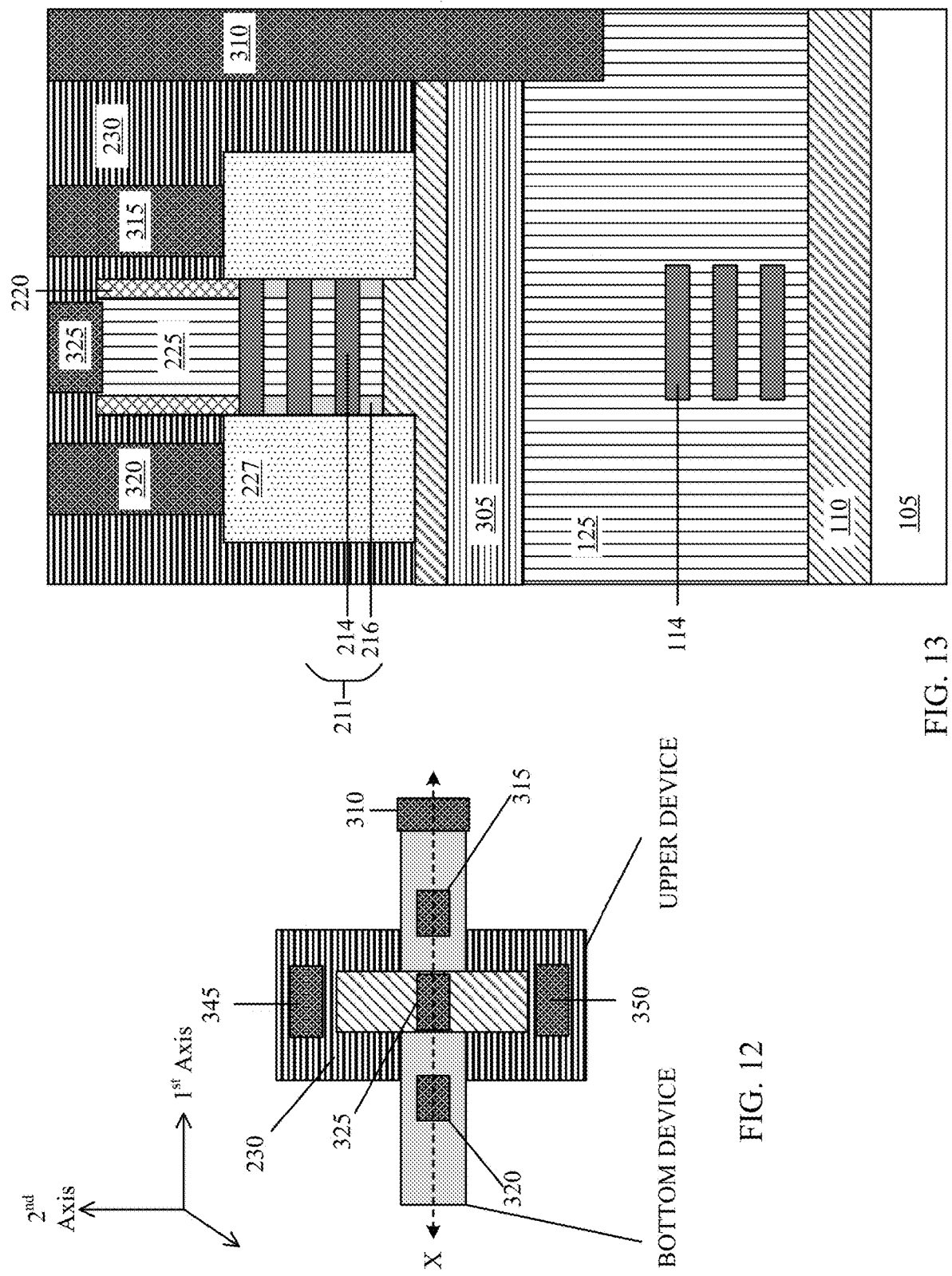
FIG. 12 illustrates a top-down view of the of the perpendicular stacked devices after the formation of bottom source/drain contacts, in accordance with the embodiment of the present invention.
FIG. 13 illustrates a cross section Y of the perpendicular stacked devices after the formation of bottom source/drain contacts, in accordance with the embodiment of the present invention.
Figures 14, 15:
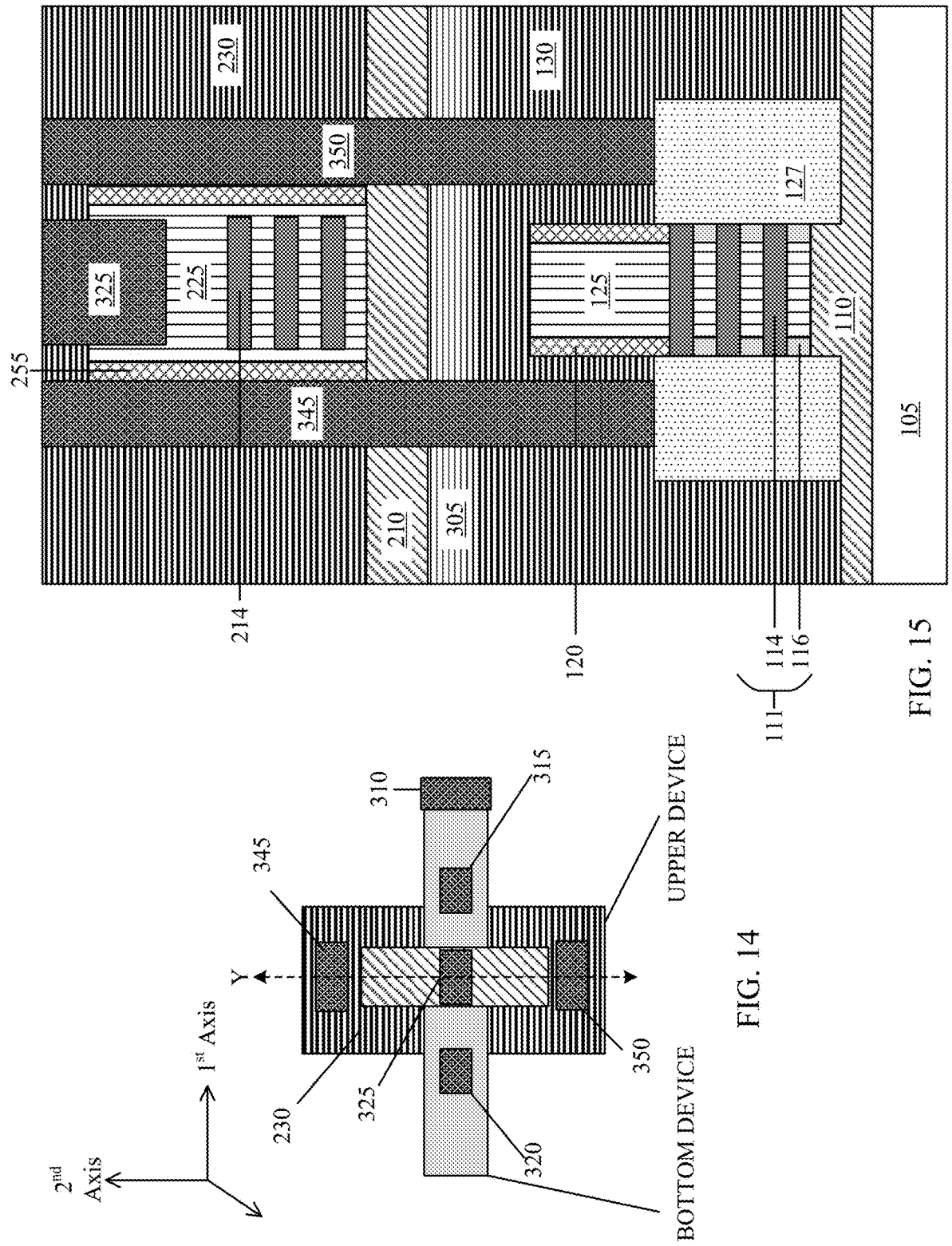
FIG. 14 illustrates a top-down view of the of the perpendicular stacked devices after the formation of bottom source/drain contacts, in accordance with the embodiment of the present invention.
FIG. 15 illustrates a cross section Y of the perpendicular stacked devices after the formation of bottom source/drain contacts, in accordance with the embodiment of the present invention.

FIGS. 12, 13, 14, and 15 illustrate the process stage after fabrication of bottom source/drain contacts. By relocating the upper gate contact 325 to the where the upper device overlaps the bottom device allows for the relocation of the bottom source/drain contacts 345, 350. Furthermore, by locating the upper gate contact 325 to the location shown in FIGS. 12 and 14 allows for the decreasing the size of the upper device (e.g., how far the upper devices extend along the second axis). By utilizing a smaller upper device allows for relocation of the bottom source/drain contacts 345, 350. The bottom source/drain contacts 345 and 350 can be located above and below the upper device as illustrated by FIG. 14. The bottom source/drain contacts can be aligned with the upper gate contact 325 and the upper device along the second axis. As illustrated by FIGS. 12 and 13, the upper source/drain contacts 315 and 320 are in alignment along the first axis with the upper gate contact 325 and the bottom gate contact 310. As illustrated by FIGS. 14 and 15, the bottom source/drain contacts 345, 350 are in alignment along the second axis with the upper device and the upper gate contact 325. A spacer 255 is located between the upper gate 225 and the bottom source/drain contacts 345, and 350. The upper device as illustrated as being smaller than the bottom device, alternatively, the upper device size could be increased instead.

The FIGS. 12-15 illustrate that only the size of the upper device has been altered, but the present invention is only limited to changing the size of the upper device. The bottom device can be also altered independently of the upper device, such that the size of the bottom device can be made smaller or larger along the first axis. By independently creating the upper and bottom device and arranging the upper device perpendicular to the bottom device allows for each for more freedom in device sizing and contact placement.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
   a bottom transistor having a gate region aligned along a first axis, wherein the bottom transistor includes a plurality of bottom nanosheets; and
   an upper transistor located on top of the bottom transistor, wherein the upper transistor includes a plurality of upper nanosheets and the upper transistor includes an upper source/drain, wherein the upper transistor has a gate region that is aligned along a second axis, wherein the second axis is perpendicular to the first axis, wherein the upper source/drain is located laterally adjacent the gate region of the upper transistor, wherein the upper source/drain is located above the gate region of the bottom transistor.

2. The microelectronic structure of claim 1, wherein a portion of the upper transistor is not located above components of the bottom transistor.

3. The microelectronic structure of claim 1, wherein a portion of the bottom transistor does not have components of the upper transistor located above the bottom transistor.

4. The microelectronic structure of claim 1, wherein only a portion of the upper transistor is located above the bottom transistor where the upper transistor overlaps the bottom transistor.

5. The microelectronic structure of claim 1, further comprises:
   a first upper source/drain contact and a second upper source/drain contact; and
   a bottom gate contact.

6. The microelectronic structure of claim 5, wherein the first upper source/drain contact, the second upper source/drain contact, and the bottom gate contact are aligned along the same first axis.

7. The microelectronic structure of claim 6, further comprises:
   an upper gate contact.

8. The microelectronic structure of claim 7, wherein the first upper source/drain contact, the second upper source/drain contact, the bottom gate contact, and the upper gate contact are aligned along the same first axis.

9. The microelectronic structure of claim 5, further comprises;
   a first bottom source/drain contact; and
   a second bottom source/drain contact.

10. The microelectronic structure of claim 9, wherein the first bottom source/drain contact, the second bottom source/drain contact, and the first upper source/drain contact are aligned along the same second axis.

11. A microelectronic structure comprising:
    a bottom transistor having a gate region aligned along a first axis, wherein the bottom transistor extends a first length along the first axis; and
    an upper transistor located on top of the bottom transistor, wherein the upper transistor has a gate region that is aligned along a second axis, wherein the second axis is perpendicular to the first axis, wherein the upper transistor extends a second length along the second axis, wherein the first length and the second length are different, wherein the second length is less than the first length.

12. The microelectronic structure of claim 11, further comprises:
    a first upper source/drain contact and a second upper source/drain contact; and
    a bottom gate contact.

13. The microelectronic structure of claim 12, further comprises:
    an upper gate contact.

14. The microelectronic structure of claim 13, wherein the first upper source/drain contact, the second upper source/drain contact, the bottom gate contact, and the upper gate contact are aligned along the same first axis.

15. The microelectronic structure of claim 14, further comprises;
    a first bottom source/drain contact; and
    a second bottom source/drain contact.

16. The microelectronic structure of claim 15, wherein the first bottom source/drain contact, the second bottom source/drain contact, and the upper gate contact are aligned along the same second axis.

17. A method comprising:
    forming a first transistor on a first substrate, wherein the first transistor includes a plurality of first nanosheets and a first gate region;

forming a second transistor on a second substrate, wherein the first substrate and the second substrate are different substrates, wherein the second transistor includes a plurality of second nanosheets, a second source/drain, and a second gate region, wherein the second source/drain is located laterally adjacent to the second gate region;

attaching the second transistor on top of the first transistor; and wherein the first transistor is aligned along a first axis, wherein the second transistor is aligned on a second axis, wherein the second axis is perpendicular to the first axis, wherein the second source/drain is located above the first gate region of the first transistor.

18. The method of claim 17, wherein the first transistor extends a first length along the first axis, wherein the second transistor extends a second length along the second axis, wherein the first length and the second length are different.

* * * * *